(12) United States Patent
Blankenborg

(10) Patent No.: US 8,357,476 B2
(45) Date of Patent: Jan. 22, 2013

(54) METHOD FOR PRODUCING A BASE MATERIAL FOR SCREEN PRINTING, AND BASE MATERIAL OF THIS TYPE

(75) Inventor: Stephanus Gerardus Johannes Blankenborg, Nijmegen (NL)

(73) Assignee: Stork Prints B.V., Boxmeer (NL)

( * ) Notice: Subject to any disclaimer, the term of this patent is extended or adjusted under 35 U.S.C. 154(b) by 0 days.

(21) Appl. No.: 13/164,934

(22) Filed: Jun. 21, 2011

(65) Prior Publication Data

US 2011/0247507 A1    Oct. 13, 2011

Related U.S. Application Data

(62) Division of application No. 10/593,552, filed as application No. PCT/NL2005/000211 on Mar. 18, 2005, now Pat. No. 7,981,590.

(30) Foreign Application Priority Data

Mar. 19, 2004  (NL) ..................................... 1025774

(51) Int. Cl.
*G03F 7/09* (2006.01)
*G03F 7/11* (2006.01)
*G03F 7/12* (2006.01)
*B41F 15/00* (2006.01)

(52) U.S. Cl. ........ 430/6; 430/271.1; 430/273.1; 101/127

(58) Field of Classification Search ................ 430/308, 430/271.1, 273.1, 275.1, 6; 101/127
See application file for complete search history.

(56) References Cited

U.S. PATENT DOCUMENTS

| | | | |
|---|---|---|---|
| 4,216,019 A | 8/1980 | Reed et al. | |
| 4,302,528 A | 11/1981 | Sano et al. | |
| 4,564,580 A | 1/1986 | Ichimura et al. | |
| 4,668,329 A | 5/1987 | Shirataki | |
| 4,705,608 A | 11/1987 | Keller et al. | |
| 4,937,172 A | 6/1990 | Gervay | |
| 5,246,815 A | 9/1993 | Ichimura et al. | |
| 5,447,757 A * | 9/1995 | Cairncross et al. | 427/510 |
| 5,573,815 A | 11/1996 | Cairncross et al. | |
| 6,855,417 B2 * | 2/2005 | McCreery | 428/338 |

FOREIGN PATENT DOCUMENTS

| | | | |
|---|---|---|---|
| EP | 0 150 623 A2 | 7/1985 | |
| EP | 0 182 195 A2 | 11/1985 | |
| EP | 0 427 382 A2 | 5/1991 | |
| GB | 2 176 630 | 12/1986 | |
| JP | 62-267746 | * 11/1987 | |
| JP | 64-082944 | * 3/1989 | |

OTHER PUBLICATIONS

Machine translation of the abstract of JP 62-267746, published on Nov. 20, 1987.*
Machine translation of the abstract of JP 64-082944, published on Mar. 28, 1989.*
Translation of the relevant paragraph in JP 62-267746, published on Nov. 20, 1987.*
Translation of the relevant paragraph in JP 64-082944, published on Mar. 28, 1989.*
W. Pfirmann et al., Screen Printing, Jun. 1990; "The Rz Value: A New Concept in Screen-Quality Evaluation"; electronic copy retrieved from the internet (URL: http://www.kiwo.com/Articles/RZ%20Value%20article%20Part%201.pdf).
Kistler et al.; "Liquid Film Coating"; 1997, table of contents.
Screeny Siebdruckplatten; Brochure from Gallus Ferd, Ruesch AG.

* cited by examiner

*Primary Examiner* — Anca Eoff
(74) *Attorney, Agent, or Firm* — Hoffmann & Baron, LLP

(57) ABSTRACT

The invention describes a base material for screen printing, which comprises a protective film, a screen and an intermediate resist layer comprising photosensitive material.

3 Claims, 1 Drawing Sheet

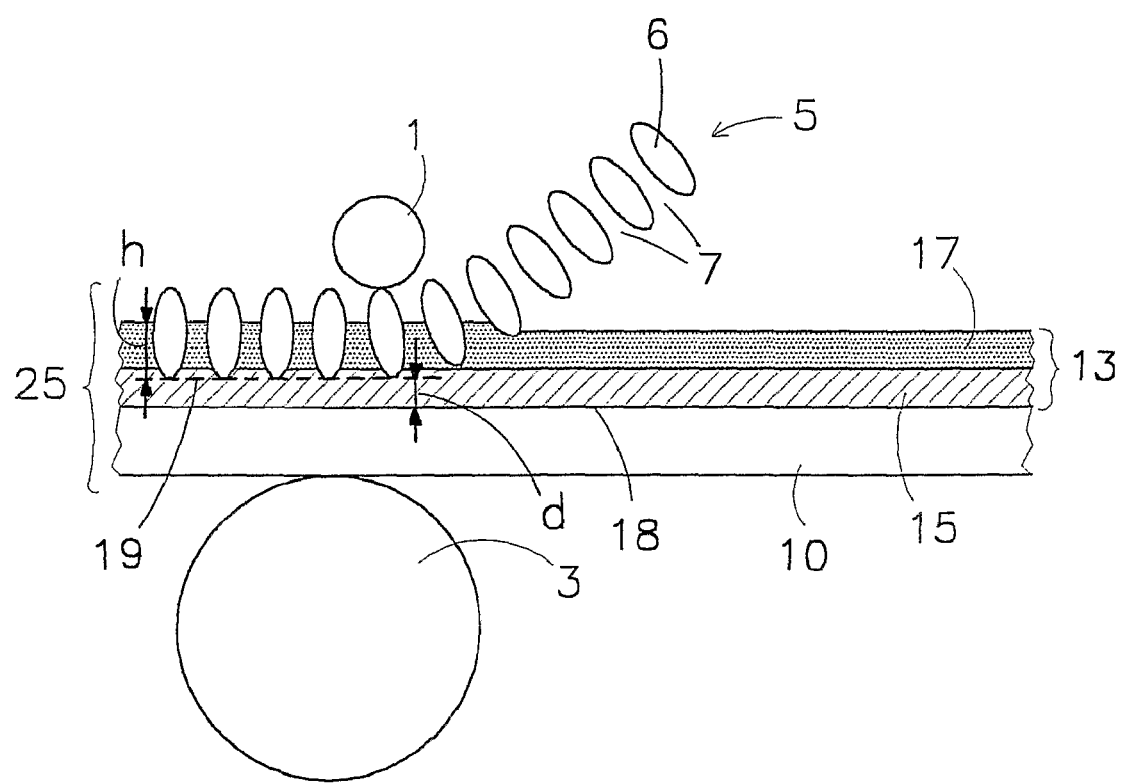

METHOD FOR PRODUCING A BASE MATERIAL FOR SCREEN PRINTING, AND BASE MATERIAL OF THIS TYPE

CROSS-REFERENCE TO RELATED APPLICATIONS

This application is a divisional application of U.S. patent application Ser. No. 10/593,552, filed Jun. 4, 2007, which claims benefit of the National Stage of International Application No. PCT/NL2005/000211, filed Mar. 18, 2005, which claims the benefit of Netherlands Application No. NL 1025774, filed Mar. 19, 2004, the contents of which is incorporated by reference herein.

FIELD OF THE INVENTION

A first aspect of the invention relates to a method for producing a base material for screen printing, which comprises a screen, a resist layer comprising photosensitive material and a protective film.

BACKGROUND OF THE INVENTION

A base material for screen printing which comprises a screen, a resist layer comprising photosensitive material and a protective film, is known per se and available from Gallus Ferd. Rüesch A G, under the trade name Screeny Siebdruckplatten. In the specialist field, the screen is also described as a network of dykes which delimit openings. The known screen comprises a woven metal mesh galvanized with nickel. When the base material is used for screen printing, first of all the protective film is removed from the base material. The resist layer is exposed according to a defined pattern, developed and the resist layer is cured in accordance with said pattern. After the unexposed, uncured resist layer has been removed, the base material can function as a stencil during the screen printing. There are also known resist layers which react in the opposite way to exposure, i.e. which cure without exposure and do not cure if they are exposed. Therefore, the negative image of the pattern exposed is cured. The protective film has the function of protecting the resist layer during storage, transportation and when the base material is being rolled up and unrolled. In addition, the film provides the base material with an attractive appearance. The base material can, for example, be made into a cylindrical shape and used in this form for screen printing, in which case—after the protective film has been removed and after the resist layer has been exposed and developed—the ink is guided through the screen using a squeegee. The pattern which is printed in the process is determined by the resist layer which is present on and in the screen.

U.S. Pat. No. 4,705,608 has disclosed a method for producing base material of this type. In one embodiment of this method, a layer of a photosensitive emulsion or solution is applied to a plastic film. Then, mesh which is provided with a covering layer that has been deposited by electroplating in order to join the nodes of the mesh to one another is pressed into the said layer. After that, a second layer of photosensitive emulsion is applied from the uncovered rear side of the mesh and pressed through the mesh in order to join the mesh to the first layer of photosensitive material, and then the unit is dried. These steps are carried out in such a way that the film comes into contact with a cylindrical heated surface. In the method, the film functions firstly as a release film, in order to prevent the first layer of photosensitive material from sticking to the heated surface at the end of the production steps. Then, if the film is not removed, it can also remain in place as a protective film to protect the photosensitive material. In another embodiment, the second layer of photosensitive material is arranged in the space between the film with the first layer on it and the mesh, it being ensured that the material applied last is pressed through the mesh openings towards the rear side. Excess material on this side is then removed with the aid of a scraper element. Instead of the first resist layer being applied to the plastic film, it is also possible to employ a ready-to-use, commercially available film with a layer of photosensitive material, in which case this layer is moistened in order for the mesh to be applied. The product of this known method is a base material in which the photosensitive material is located on both main surfaces (the printing side and the squeegee side).

GB-A-2176630 discloses a screen-printing stencil comparable to the base material described above, in regard of which it is stated that the surface of the photosensitive material has a flat surface. This material can be produced using the method described in the abovementioned US patent, in which case the wires of the mesh must not disturb the flat surface of the photosensitive material.

It has now been found that the extent to which the surface of the resist layer is flat on the side of the protective film nevertheless leaves something to be desired, in view of the requirements that are often imposed: despite the abovementioned requirement imposed on the execution of the method, the surface of the resist layer is visible in the known base material, in the form of a more or less undulating surface, also referred to as a relief. When the base material is used for screen printing, this relief has proven to have an adverse effect on the results of printing, since the printed image is less sharp at locations where the relief is prominent.

Furthermore, if the base material is used as a screen-printing stencil, it may be disadvantageous for both the squeegee side and the printing side to be provided with a resist layer.

SUMMARY OF THE INVENTION

It is an object of the present invention to completely or at least partially resolve the above problems by means of a novel method for producing the base material, producing a base material with less relief.

A further object of the invention is to provide a method for producing the base material, in which the openings in the screen material thereof, in particular in the case of an electroformed screen, are virtually uniformly filled with photosensitive material.

Yet another object is to provide a method which produces substantially no wastage of photosensitive material.

According to a first aspect, to this end the invention comprises a method for producing a base material for screen printing, which comprises a screen, a resist layer of photosensitive material and a protective film, which method comprises the steps of:
a) applying a first resist layer to one side of the protective film,
b) drying the first resist layer,
c) applying an additional resist layer to the first resist layer, and
d) then applying a screen to the additional resist layer, the side of the additional resist layer to which the screen is applied being wet, and the screen being pressed into the additional resist layer under pressure from a pressure-exerting element which makes direct contact with the screen, in particular a roller, and in which the resist layer comprises the additional resist layer and the first resist layer.

In the method according to the invention, a first resist layer in the form of an emulsion or solution of photosensitive material is applied to one side of the protective film, which resist layer is then dried. Then, a second resist layer, of optionally the same photosensitive material, is applied to the first resist layer. Next, the screen is applied to the (still) wet additional resist layer and is pressed into the latter with the aid of a pressure-exerting element, in particular a roller. Drying of the first resist layer prevents the screen from penetrating deep into it and thereby adversely affecting the smoothness or planarity of the surface of the first resist layer adjoining the protective film, even if the first resist layer is moistened again by the application of the additional resist layer. After the application of the additional resist layer, the screen is pressed into the latter in a controlled way with the aid of the pressure-exerting element, so that the filling level or penetration depth of the resist material in the screen openings is substantially uniform. Non-uniform filling levels are unwanted as they lead to what are known as "dark spots". The exertion of pressure also promotes the bonding between the screen and resist layer and/or enhances the pace at which sufficient adhesion is obtained. The use of a roller has the advantage that long and wide sheets of base material can be produced continuously. Moreover, the pressure with which the roller presses the screen into the resist layer can be accurately monitored and controlled over the entire sheet of base material. The product of the method according to the invention is a base material, with the screen only being provided with the resist layer, which is covered by a protective film, on one side.

It is advantageous for a counter-pressure roller to be used opposite the roller, and on the other side of the assembly made up of screen, resist layer and protective film.

The method according to the invention has the advantage firstly that it produces a base material whereof the surface of the resist layer has an improved smoothness, i.e. a reduced relief, on the side of the film. The relief—also referred to as the roughness—of the surface of layers is expressed by a Rz value, which is measured in accordance with the DIN 4768 standard. The method according to the invention makes it possible to reduce the relief of the surface of the resist layer on the film side to such an extent that the Rz value is less than 15 micrometres, preferably less than 5 micrometres, most preferably 1-2 micrometres. According to the method of the invention, this reduction is achieved by the resist layer being built up in at least two steps, in such a manner that the screen is applied to a wet side of the additional resist layer that has previously been applied. Furthermore, the controlled exertion of pressure efficiently regulates the height to which the screen is filled with resist without any inclusion of air. It is preferable for the filling to be at its maximum, i.e. such that the screen openings are filled up to the other side. This produces a screen material which is provided with resist material on one side and has a controlled height of resist within the screen openings. This also leads to less wastage of photoresist emulsion than in the known method.

The application of the resist layer to the protective film can be carried out in various ways which are known in the specialist field, for example using a patterned roller, a squeegee, doctor, stencil or screen, and also by the processes known as slot coating, slide coating and knife and roll coating (cf. "*Liquid film coating*" by S. F. Kistler and P. M. Schweizer, Chapmann & Hall, London, 1997). The first and/or additional resist layers can be applied in various steps, i.e. the first and additional resist layers may be composed of different resist sublayers. It is preferable for the first resist layer to be applied in one step and then the additional resist layer to be applied in one step. The first resist layer is preferably dried at a temperature which is lower than the curing temperature of the resist layer. This means that the drying step b) does not, in a later stage of use of the base material, influence the exposure of the resist layer with a pattern corresponding to the image that is to be printed. A suitable drying temperature is selected as a function of the resist used, for example a temperature of lower than 100° C., and preferably around 50° C., for a water-based resist with a water content of 55%. As an alternative, the drying of the first resist layer can take place at a temperature which is equal to or higher than the curing temperature of the resist layer, provided that the drying is carried out for a very short period of time, so that curing of the first resist layer does not yet occur. The feature that the side of the additional resist layer to which the screen is applied is "wet", is to be understood as meaning that the resist has a viscous character, with the result that during the application of the screen to the additional resist layer, the resist can be deformed and/or can flow into the openings between the dykes of the screen. Besides, it should be noted that during step c) the additional resist layer influences the dry character of the first resist layer, with the result that the first resist layer also becomes wet to a certain extent in the region where it adjoins the additional resist layer.

The screen reaches a certain depth in the overall resist layer depending on the viscosity of the resist layer and the pressure with which the screen is applied to the additional resist layer. In this case, the screen can penetrate not only into the additional resist layer but also into the first resist layer. In general, for a given pressure which is exerted, the depth which the screen reaches in the resist layer is limited by the position where the resist in the resist layer is dry or where the viscosity of the resist in the resist layer has become too high. In this case, the thickness of the dried first resist layer can play a role in determining the depth reached by the screen in the resist layer as a whole. For the sake of completeness, it should be noted that the application of the screen to the resist layer according to the invention implies an adhesion between screen and resist layer.

There are various suitable types of screen for the base material, such as an optionally galvanized woven plastic fabric, a woven metal mesh, a galvanized knitted fabric or woven fabric of plastic threads or metal wires, and screens formed by electroforming. It is preferable for the screen to have a mesh number of 70 to 500. The openings in the screen are, for example, round, orthogonal or hexagonal.

For the sake of completeness, it should be noted that the resist layer as a whole is dried before the base material is stored or exposed for further use.

Step d) of the method according to the invention is advantageously carried out in one plane, whether horizontal or vertical, so that the assembly, after the screen has been arranged in the resist, is not exposed to stresses, for example during deformation in order to be wound up, before the resist has dried.

In the method according to the invention, it is preferable for the screen to be applied without the additional resist layer being dried beforehand. This creates a rapid and simple method for carrying out the method according to the invention.

As an alternative, the additional resist layer is dried beforehand, for example for the purpose of storage, and is moistened at any subsequent time.

Further preferably, in the method according to the invention a screen which is an electroformed screen is applied. An electroformed screen is formed by growing a metal skeleton by any galvanic method on a network of conductive tracks of a die. The conductive tracks, which delimit insulating regions, correspond to the dykes of the skeleton, which dykes delimit openings corresponding to the insulating regions. In general, after the die has been removed, the skeleton is grown further, in one or more secondary steps, by the application of a metal layer in an electroplating bath. An electroformed screen itself has a surface—referred to in the description of figures below as a contact surface—which is highly planar, since in electroforming technology the screen is grown uniformly onto a flat die, with the dykes having an even, i.e. uniform, thickness. A woven fabric, by contrast, inherently has a varying thickness on account of the warp and weft threads (i.e. where the threads overlap its thickness is double that of the threads, whereas elsewhere it is equal to that of the threads), and consequently has a more uneven surface. Electroplated woven fabrics in accordance with U.S. Pat. No. 4,705,608 also have this uneven surface, albeit to a lesser extent. When a woven fabric of this type has been covered with a resist layer, the unevenness of the woven fabric may continue to make its presence felt in the surface of the resist layer, in such a manner that more of a relief is formed in the resist layer. In addition, the high degree of flatness of an electroformed screen leads to a uniform distance between the dykes of the screen and the surface of the resist layer on the side of the protective film. The associated advantages are discussed below in connection with the second aspect of the invention.

In the method according to the invention, it is particularly preferable to use a roller of which the pressure-exerting surface is provided with a coating material with an open-cell structure. A method of this type prevents the formation of what are known as dark spots in the base material. Dark spots are formed, for example, when a screen is pressed into a resist layer under pressure from a roller which blocks the openings in, the screen during the pressing operation. In this case, the air enclosed in an opening that has been blocked, is compressed. As a result, a pressure difference is produced between an opening which has been blocked by the roller and other openings which have not been blocked, with the result that the quantity of resist which flows into the openings in the base material obtained is not uniform, which is visible in the base material itself. The screen looks darker at the locations where too much resist is present in the openings, hence the name dark spots. The open structure of the coating material prevents the undesirable build-up of pressure, which can give rise to the formation of dark spots. Examples of suitable coating materials with an open structure are woven mesh, open rubber, foam or open cloth.

A further preferred embodiment of the method according to the invention makes use of a roller which is in contact with the screen in the tangential direction over a length which is less than the diameter of the openings of the screen at the location of the contact surface of the screen. A method of this type further prevents the formation of the dark spots in the base material, since the dimensioning of the roller establishes that it is in fact no longer possible for an opening to be blocked while the screen is being pressed into the resist layer.

In the method according to the invention, it is preferable to use a roller which is compressible. It is advantageous to use a roller which is only slightly compressible, i.e. slightly deformable, so that the roller can correct any minor unevenness in the contact surface of the screen. The roller advantageously comprises a rubber roller made from hard rubber, with a hardness of 70-90 Shore, preferably in combination with a counter-pressure roller with a higher hardness, for example made from metal.

In a subsequent preferred embodiment of the method according to the invention, a first resist layer is applied with a thickness at least equal to that of the additional resist layer which is applied. For the sake of clarity, it should be noted that where the text refers to the thicknesses of the two resist layers, this is to be understood as meaning the thicknesses in the dry state. It has been found that the base material which is produced according to this method has a high degree of smoothness.

In the method according to the invention, it is preferable to apply an additional resist layer with a thickness of from 2 to 10 micrometres. This type of thickness has in practice proven sufficient to apply the screen to the resist layer. For practical reasons, the thickness of the first resist layer is advantageously between 5 and 20 micrometres.

Further preferably, in the method according to the invention, the additional resist layer which is applied comprises the same type of resist as the first resist layer which is applied. This has the advantage that one type of resist is sufficient to carry out the method, and that the first and additional resist layers have similar properties in terms of drying rate, viscosity, curing rate, etc.

In a preferred embodiment of the method according to the invention, two intermediate steps are carried out between steps b) and c), namely:
i) covering the first resist layer with a separating sheet and rolling up the subassembly comprising protective film, first resist layer and separating sheet, and
ii) then unrolling the rolled-up subassembly and removing the separating sheet.

For the sake of clarity, it should be noted that the separating sheet covers that side of the resist layer which is not provided with the protective film. The separating sheet prevents the resist layer from sticking when the protective film to which the dried first resist layer has been applied is being rolled up. If a separating sheet were not present, unrolling could present problems. The cover provided by the separating sheet offers the advantageous option of obtaining a rolled-up subassembly which can be unrolled without problems. This provides the possibility of applying a first resist layer at a certain location while the second resist layer can be applied at another location, preferably directly followed by the application of the screen. Examples of suitable separating sheets include label paper, silicone paper, bleached paper or covering paper.

A second aspect of the invention relates to a base material for screen printing, which comprises a protective film, a resist layer comprising photosensitive material, and a screen, the surface of the resist layer, on the side on which protective film is present, being sufficiently smooth for the Rz value of the said surface to be lower than 15 micrometres. Base materials of this type lead to improved printing results during screen printing, as has already been explained above.

In the base material according to the invention, it is preferable that the distance from the dykes of the screen to the surface of the resist layer on the side of the protective film is uniform. The abovementioned distance is to be understood as meaning the shortest distance between the dykes and the said surface of the resist layer, i.e. measured from the point of a dyke which point has penetrated deepest into the resist layer. The said distance being uniform means that the variation in the distance is slight, preferably less than ±2 micrometres. Base materials of this type lead to improved printing results during screen printing.

Further preferably, in the base material according to the invention the height of the resist layer is uniform between the dykes of the screen. In this context, the height is to be understood as meaning the distance between the point of a dyke which point has penetrated deepest into the resist layer and the surface of the resist layer between two dykes on the free side of the screen, i.e. the side remote from the protective film. In this context, the term uniform is to be understood as meaning that the variation in depth is slight, preferably less than ±5 micrometres. Base materials of this type lead to improved printing results during screen printing.

A third aspect of the invention relates to a base material for screen printing, which comprises a protective film, a resist layer comprising photosensitive material, and an electroformed screen. In this case, the base material preferably satisfies the conditions as imposed in accordance with the second aspect of the invention. As has been noted above, the surface of an electroformed screen has a high degree of flatness compared to other screen materials, which has a beneficial influence on the smoothness of the resist layer on the side of the protective film.

The protective film may be produced from various polymer materials, for example polyethylene, polypropylene, polyester, polyvinyl chloride, polyacrylate, PET, PEI, PBT, PC, etc. The thickness of the film is, for example, between 25 and 500 micrometres.

The resist which is used for the resist layer is advantageously a resist based on organic solvents or water. The dry matter content of the resist is preferably between 30 and 60%. The particle size of the resist is preferably less than 25 micrometres, more preferably less than 10 micrometres. The viscosity of the resist is preferably between 1000 and 4000 cP. The resist comprises constituents selected from the group consisting of UV acrylate resin, polyvinyl acetate, polyvinyl alcohol, alkyd, epoxy, melamine, bichromate, diazo compound and water-borne SBQ photopolymer. As has already been noted above, it is advantageous to use the same resist for the first resist layer and the additional resist layer.

Furthermore, it is advantageous for the surface tension of the resist which is applied direct to the film to be less than or equal to the surface tension of the film, in order to achieve a favourable flow of the resist on the film during application of the first resist layer. For this purpose, as an alternative it is also possible to increase the surface tension of the film by a pre-treatment in a corona device.

The invention will be explained below on the basis of the following example.

Example 1

At ambient temperature, a first resist layer is applied by knife and roll coating to a 100 micrometre thick polyester film. The polyester film has an Rz value of between 0.3 and 0.4 micrometre and a surface tension of between 40 and 42 mN/m. The resist has a surface tension of between 35 and 38 mN/m. The resist is a water-borne UV-curing emulsion with a dry matter content of 50% and a viscosity of 3000 cP. The resist comprises as dry matter UV acrylate resin, polyvinyl acetate, polyvinyl alcohol and diazo compound. The particle size of the resist is on average 1.5 micrometre.

The first resist layer is dried at 50° C. and has a thickness of 10 micrometres after it has been dried. The dried subassembly made up of polyester film and first resist layer is rolled up, with the resist layer side covered with a separating sheet.

In a subsequent stage, the rolled-up subassembly is unrolled and an additional resist layer is applied to the first resist layer in a similar manner to that described above for the first resist layer. Immediately afterwards, a screen is applied in the still-wet resist layer using a roller, followed by drying at 50° C. The roller is a rubber roll with a hardness of 90 Shore and exerts a pressure of 2 bar. The base material obtained is rolled up with a separating sheet. The thickness of the additional layer is determined afterwards on a dried part to which no screen has been applied, and is 6 micrometres.

BRIEF DESCRIPTION OF THE DRAWINGS

The invention will also be explained with reference to the appended drawing, in which:

FIG. 1 diagrammatically depicts a cross section through the method according to the invention.

DETAILED DESCRIPTION OF THE PREFERRED EMBODIMENT

FIG. 1 illustrates a rotatably mounted pressure-exerting roll 1 made from hard rubber (with a hardness of 70-90 Shore), a counter-pressure roll 3 made from metal (with a Shore hardness greater than that of pressure-exerting roll 1). Starting from the right-hand side of the figure, an electroformed screen 5 is supplied from above, comprising a network of dykes 6 which delimit openings 7. At the same time, an assembly comprising a polyester film 10 and a resist layer 13 composed of a first resist layer 15 and an additional resist layer 17 is supplied from the right-hand side, beneath the screen 5. The screen 5 is pressed into the resist layer 13 between the pressure-exerting roll 1 and the counter-pressure roll 3. During this process, the screen 5 penetrates through the additional resist layer 17 and partially into the first resist layer 15. In this way, a base material 25 according to the invention is obtained on the left-hand side of rolls 1 and 3, this base material 25 having the following characteristics. The distance d from the screen to the surface of the resist layer 13 on the side of the protective film 10 is uniform. The distance d, to clarify, is represented as the distance between the surface 18 of the resist layer 13 on the side of the film 10, on the one hand, and the tangent plane 19 of the dykes of the screen 5 on the side which projects into the resist layer 13, on the other hand. The height h of the resist layer 13 is also uniform between the dykes 6. For clarity, the height h is represented as the distance between the tangent plane 19 of the dykes of the screen and the surface of the resist layer 13 between two dykes 6 on that side of the base material 25 where the screen 5 projects out of the resist layer 13.

What is claimed is:

1. A base material for screen printing, which comprises a screen, a resist layer comprising photosensitive material and a protective film, the screen comprising a network of dykes which delimit openings, wherein the surface of the resist layer, on the side on which protective film is present, is sufficiently smooth for the Rz value of the said surface to be lower than 15 micrometers and the height (h) of the resist layer is uniform between the dykes of the screen.

2. The base material according to claim 1, wherein the distance (d) from the dykes of the screen to the surface of the resist layer on the side of the protective film is uniform.

3. The base material for screen printing according to claim 1, which comprises an electroformed screen.

* * * * *